(12) United States Patent
Lonsdale et al.

(10) Patent No.: US 6,467,351 B2
(45) Date of Patent: *Oct. 22, 2002

(54) APPARATUS FOR TRACKING RESONANT FREQUENCY

(76) Inventors: Anthony Lonsdale, Balscott Mill, Balscote, Banbury, Oxfordshire OX15 6EY (GB); Bryan Lonsdale, Balscott Mill, Balscote, Banbury, Oxfordshire OX15 6EY (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/297,984

(22) PCT Filed: Nov. 13, 1997

(86) PCT No.: PCT/GB99/03028

§ 371 (c)(1),
(2), (4) Date: Jul. 28, 1999

(87) PCT Pub. No.: WO91/13832

PCT Pub. Date: Sep. 19, 1991

(65) Prior Publication Data

US 2002/0100325 A1 Aug. 1, 2002

(30) Foreign Application Priority Data

Nov. 13, 1996 (AU) .............................................. PO 3590

(51) Int. Cl.⁷ ............................................... G01H 13/00

(52) U.S. Cl. ...................................................... 73/579

(58) Field of Search .......................... 73/579, 580, 583, 73/589, 590, 597, 599, 620, 630, 631, 643, 654, 657; 324/602, 71.1, 633

(56) References Cited

U.S. PATENT DOCUMENTS 3,936,765 A    2/1976   Lewis
4,062,227 A   * 12/1977   Heyman ...................... 73/630

(List continued on next page.)

FOREIGN PATENT DOCUMENTS

| EP | 0 518 900 | 9/1991 |
| GB | 2 019 147 A | 10/1979 |
| WO | 91 13832 A | 9/1991 |

OTHER PUBLICATIONS

Tracor, Inc., "Model 304BR Rubidium Frequency Standard", 1968. (To follow).

*Primary Examiner*—Richard A. Moller
(74) *Attorney, Agent, or Firm*—Davis & Bujold, P.L.L.C.

(57) ABSTRACT

An apparatus for tracking the varying resonant frequency of an electrically resonant structure, characterized by: a variable frequency oscillator providing an excitation signal of a variable frequency encompassing the possible resonant frequency range of the resonant structure, a bidirectional RF transmission line connecting the variable frequency oscillator and the resonant structure, the transmission line incorporating a directional coupler which generates a directional coupler signal proportional to the reflected signal from the resonant structure, the directional coupler signal being conditioned by a processor to provide a feedback signal to the input of the variable frequency oscillator, such that the mean frequency of the excitation signal is caused to continuously track the varying resonant frequency resonant structure. Typically the tracking of the varying resonant frequency involves at least two functions, a first search function for initially searching the possible resonant frequency range of the resonant structure and, once resonance of the resonant structure is established, a second following function for following the variable resonant frequency as it varies as a function of time.

22 Claims, 4 Drawing Sheets

U.S. PATENT DOCUMENTS

| | | | |
|---|---|---|---|
| 4,100,811 A | | 7/1978 | Cullen et al. |
| 4,760,352 A | | 7/1988 | Ash |
| 5,025,222 A | * | 6/1991 | Scott et al. .................. 324/639 |
| 5,076,094 A | * | 12/1991 | Frye et al. .................. 73/19.03 |
| 5,374,521 A | * | 12/1994 | Kipliing et al. ................ 435/6 |
| 5,447,845 A | * | 9/1995 | Chu et al. ....................... 435/6 |
| 5,471,147 A | * | 11/1995 | Allen et al. .................. 324/635 |
| 5,748,002 A | * | 5/1998 | Scott et al. .................. 324/633 |
| 5,795,993 A | * | 8/1998 | Pfeifer et al. ............... 73/24.01 |
| 5,974,882 A | * | 11/1999 | Heath ........................... 73/579 |
| 6,166,551 A | * | 12/2000 | Scott et al. .................. 324/637 |

* cited by examiner

APPARATUS FOR TRACKING RESONANT FREQUENCY

TECHNICAL FIELD

This invention relates to a method and apparatus for tracking the varying resonant frequency of an electrically resonant structure. More particularly the invention is directed towards applications where said structure is mounted remotely from the driving and sensing electronics.

BACKGROUND ART

The prior art most closely related to that of the present invention is the technique for determining the excitation frequency of rubidium electrons in a rubidium gas cell atomic clock (as described in model 304BR Rubidium Frequency Standard, Tracor Inc. 1968). The rubidium atoms in the closed gas cell are excited by an alternating electromagnetic field of very high frequency. If the frequency exactly matches the spin frequency of the electrons in the outer shell of the rubidium atoms, the electrons will change energy state. To measure this change, optical radiation is shone through the cell and detected by a photo diode. The light intensity is at a minimum when the atoms are excited at the correct frequency. To detect this minimum, the excitation frequency is swept a small amount either side of resonance and the output of the photo detector is applied as feedback to the exciting frequency to allow the minimum light intensity to be maintained.

Although the basic philosophy of this prior art is similar to the present invention, the technical field of the invention is completely divorced and the method of implementation is completely different. The object of this invention is to track the resonant frequency of an electrically resonant structure whose resonant frequency varies continuously with time. An example of such a structure is a surface acoustic wave (SAW) resonator used as a strain or temperature sensor as described in our European Patent 0518900.

SUMMARY OF INVENTION

The first aspect of the present invention is an apparatus for tracking the varying resonant frequency of an electrically resonant structure, characterised in that it comprises a variable frequency oscillator providing an excitation signal of a variable frequency encompassing the possible resonant frequency range of said resonant structure, a bidirectional RF transmission line connecting said variable frequency oscillator and said resonant structure, a directional coupler incorporated in the transmission line which generates a directional coupler signal proportional to the reflected signal from said resonant structure, said directional coupler signal being conditioned by a processor to provide a feedback signal to the input of the variable frequency oscillator, such that the mean frequency of said excitation signal is caused to continuously track the varying resonant frequency of said resonant structure.

Preferably the tracking of said varying resonant frequency involves at least two functions, a first search function for initially searching the possible resonant frequency range of said resonant structure and, once resonance of said resonant structure is established, a second following function for following said variable resonant frequency as it varies as a function of time.

Preferably, in a first embodiment, said processor comprises a detector which detects said directional coupler signal, a synchronous rectifier for selectively rectifying the output of the detector relative to phase a frequency source having at least one master frequency output driving said synchronous rectifier, an integrator for conditioning the output from said synchronous rectifier, said integrator being input into a summer which also receives a second input from said frequency source for modulating the feedback signal to said variable frequency oscillator, thereby providing said following function It is preferred that said second input from said frequency source is synchronised with said master frequency output of said frequency source.

Preferably said frequency source also provides a search frequency output which is substantially lower than said master frequency output. The search frequency output being input into said integrator and therefore causing said variable frequency oscillator to sweep through said possible resonant frequency range of said resonant structure in the absence of any feedback signal.

Preferably the output of said variable frequency oscillator is monitored to indicate the resonant frequency of said electrically resonant structure. Alternatively or additionally, an analogue signal from the output of said integrator or summer may be used indicate the resonant frequency of said resonant structure.

Preferably, in a second embodiment, said processor comprises a double balance mixer which receives said directional coupler signal from said directional coupler and said excitation signal from said variable frequency oscillator and provides a phase proportional DC output to an integrator for conditioning the output of said integrator providing said feedback signal to the variable frequency oscillator, thereby providing said following function.

Preferably the electrically resonant structure is at least partially composed of piezoelectric material. Suitable piezoelectric materials include quartz and directionally orientated zinc oxide.

Preferably the electrically resonant structure is electrically excited by means of at least one interdigital array (IDA). Suitable resonant structures which incorporate IDAs are surface acoustic wave (SAW) resonators, shallow bulk acoustic wave (SBAW) resonators or the like. Preferably the variable impedance of the resonant structure results from the variation in the pitch of the IDA or mass loading of the resonant structure.

Preferably the variation in the pitch of the IDA results from strain of the resonant structure.

Preferably the resonant structure is substantially rigidly mounted to a surface subject to strain, and this strain is therefore imparted to said resonant structure.

Strain of said surface may be caused by physical quantities such as applied load, applied bending moment, applied pressure, or thermal expansion caused by temperature Mass loading of the resonant structure may be caused by absorption of fluids into the surface of the resonant structure in the presence of specific fluids or by physical quantities such as humidity.

Preferably the directional coupler may be a transformer, Maxwell Bridge (wire line) or Lange coupler.

Preferably the RF transmission-line incorporates a non-contacting in-line coupler, which may be an untuned or tuned transformer, laser, optical, capacitive or RF coupler. Alternatively the RF transmission line is a continuous electrical conductor between the frequency source and the resonant structure.

Preferably the electrically resonant structure is mounted on the surface of a rotating member subject to strain, with the in-line coupler allowing the transmission of said excitation signal and said reflected signal to and from said rotating member respectively, in a non-contacting manner.

Preferably the output impedance of the variable frequency oscillator should be substantially conjugately matched to any one of said bidirectional RF transmission line, resonant structure, directional coupler, and in-line coupler.

The second aspect of the resent invention is a device for measuring differential strain incorporating two or more apparatuses for tracking the varying resonant frequenes of respective two or more electrically resonant structures, characterised in that each tracking apparatus comprises a variable frequency oscillator providing an excitation signal of a variable frequency encompassing the possible resonant frequency range of its respective resonant structure, a bidirectional RF transmission line connecting said variable frequency oscillator and said respective resonant structure, said transmission line incorporating a directional coupler which generates a directionial coupler signal proportional to the reflected signal from said respective resonant structure, said directional coupler signal conditioned by a processor to provide a feedback signal to the input of the variable frequency oscillator, such that the mean frequency of said excitation signal is caused to continuously track the varying resonant frequency of said respective resonant structure.

Preferably the outputs of at least two variable frequency oscillators of said two or more apparatuses provide inputs to a mixer, the output of which is used to indicate a differential frequency which relates of said differential strain.

Preferably the resonant frequencies of said two or more resonant structures of respective said apparatuses differ from one another. Alternatively, said two or more resonant structures may have substantially the same resonant frequency.

BRIEF DESCRIPTION OF DRAWINGS

The present invention will now be described by way of example with reference to the accompanying drawings of which.

MODE OF CARRYING OUT INVENTION

Figure 1:
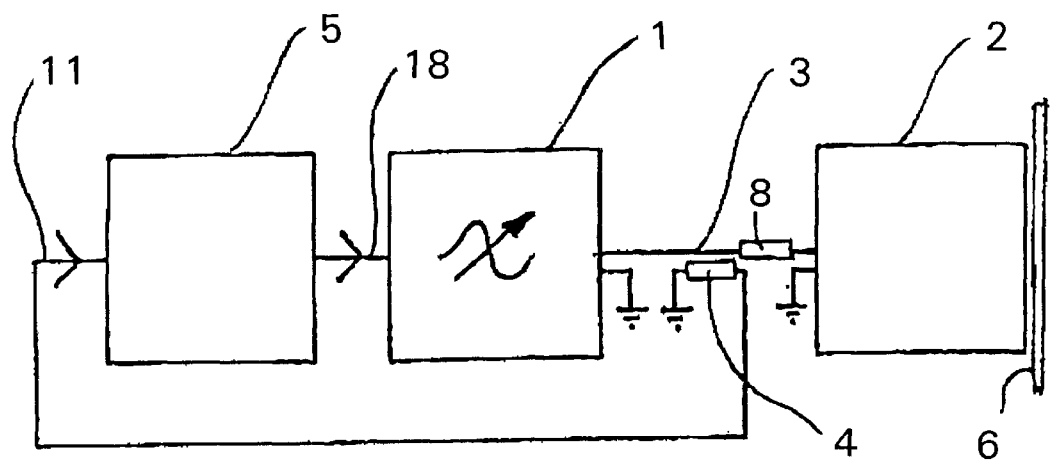
FIG. 1 is a schematic layout depicting a first embodiment of the present invention.

FIG. 1 shows a basic circuit diagram of the first aspect of the invention. Variable frequency oscillator (VFO) 1 is electrically connected to electrically resonant structure 2 of varying resonant frequency via bidirectional RF transmission line 3 incorporating directional coupler 4. The output of directional coupler 4 is connected to the input of processor 5 If the resonant frequency of structure 2 is such that it exactly matches the frequency supplied by VFO 1, all the energy supplied to structure 2 will be dissipated by structure 2, and none will be reflected back to VFO 1. As the resonant frequency of structure 2 varies luring its operation, the frequency supplied by VFO 1 will no longer match the resonant frequency of the circuit, and energy will be reflected back to VFO 1 from structure 2. Directional coupler 4 serves to measure this reflected energy return.

Directional coupler 4 may preferably be one of many known types, including a transformer, a Maxwell Bridge (sometimes known as a wire line) or a Lange coupler. The output of directional coupler 4, henceforth termed the directional coupler signal 11, is frequency synchronised with the excitation frequency, but with amplitude and phase modulated as a function of the difference between the excitation frequency supplied by VFO 1 and the resonant frequency of structure 2. The amplitude of directional coupler signal 11 is at a minimum when the frequency of the excitation signal supplied by source 1 matches the resonant frequency of structure 2, and increases as the resonant frequency of the structure moves away from the matched condition. The coupler signal 11 does not serve to indicate whether the resonant frequency of structure 2 is higher or lower than that of VFO 1, only the absolute amount of mismatch. The phase of directional coupler signal 11 relative to the excitation signal supplied by VFO 1 yields the direction of mismatch. By utilising the output received from directional coupler 4, processor 5 is able to control the output of VFO 1 so as the mean output frequency is equal to the resonant frequency of structure 2 at any point in time, henceforth termed a following function A more detailed description can be found in our co-pending PCT Patent Application entitled 'Apparatus for Measuring Impedance of a Resonant Structure' filed on the same date as the present application.

An alternative embodiment of the system could include an in-line coupler 8 between VFO 1 and structure 2 as also described in the above referenced co-pending PCT Application. This would allow non contact measurement of the resonant frequency of structure 2 if it were mounted, for example, on a rotating shaft.

Figure 2:
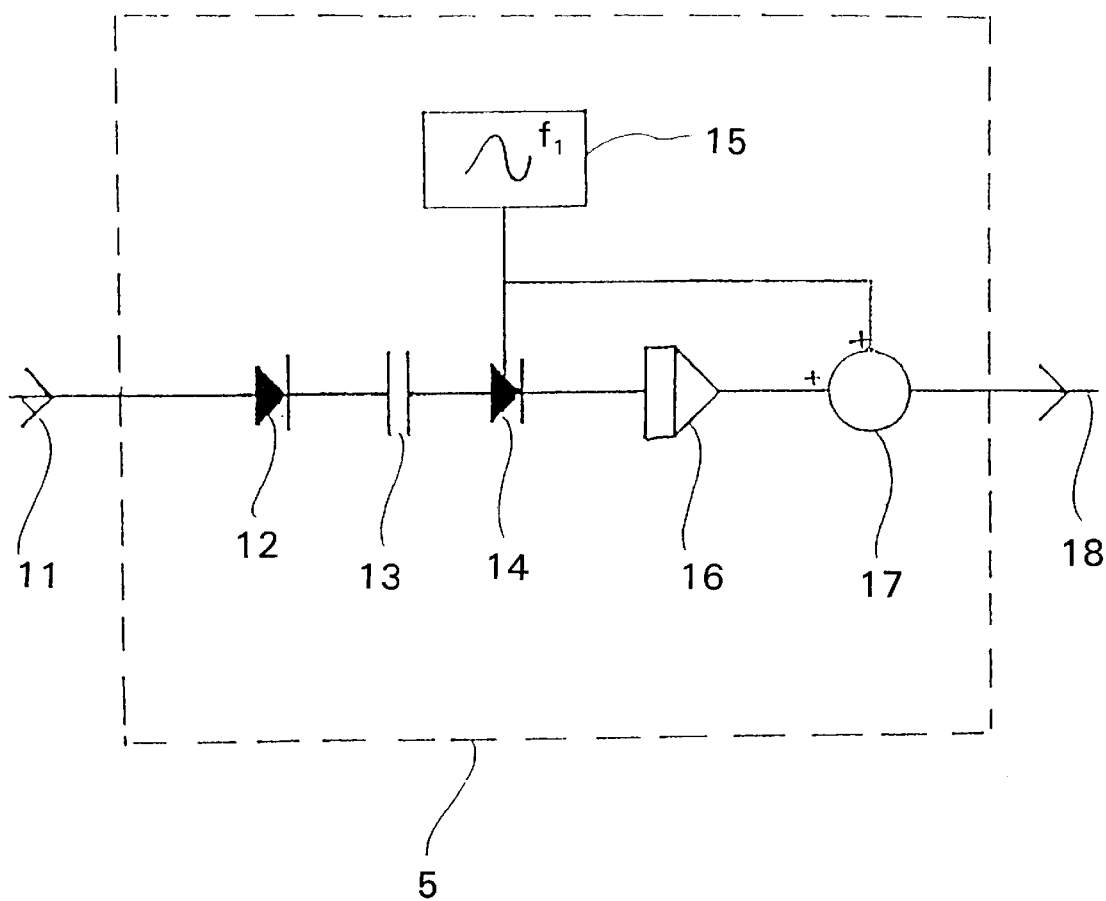
FIG. 2 is a schematic layout of the internal components of the processor of the first embodiment of the present invention shown in FIG. 1, to enable the following function.

FIG. 2 in conjunction with FIG. 1 serve to show one embodiment of processor 5 which will enable the following function to be carried out. Directional coupler signal 11 is rectified by detector 12 to yield a waveform at substantially the same frequency as the excitation signal supplied by VFO 1 to resonant structure 2 with an amplitude varying from zero volts to a maximum. Decoupler 13 AC couples directional coupler signal 11 resulting in a waveform symmetrical about zero volts. Synchronous rectifier 14 then rectifies the signal relative to a synchronising input frequency ($f_1$) supplied by master frequency source 15. The resulting output of synchronous rectifier 14 is thus a signal whose RMS DC level is a function of (a) the phase difference between the input to synchronous rectifier 14 and master frequency source 15 and (b) the amplitude of the input to the synchronous rectifier 14. The output of synchronous rectifier 14 is fed to integrator 16 whose-output is proportional to the product of the RMS value of the input and time. The output of integrator 16 is then supplied to summer 17 which has a second input supplied by master frequency sourceE15. The output of summer 7 is therefore a DC value supplied by integrator 16 with a superimposed AC component supplied by master frequency source 15. This output is the control signal supplied to VFO 1 in FIG. 1, henceforth termed feedback signal 18. The excitation signal supplied by VFO 1, is a frequency whose mean value is a function of the DC level supplied by integrator 16, which has a frequency modulation of amplitude and frequency being a function of the master frequency from master frequency source 15. In this way the mean frequency of the excitation signal supplied by VFO 1, at any point in time, is the instantaneous resonant frequency of structure 2 and can be measured and displayed as such. Alternately, the output of integrator 16 will provide an analogue signal proportional to the resonant frequency, and this signal can be measured and calibrated to give a direct reading of the resonant frequency.

Figure 3:
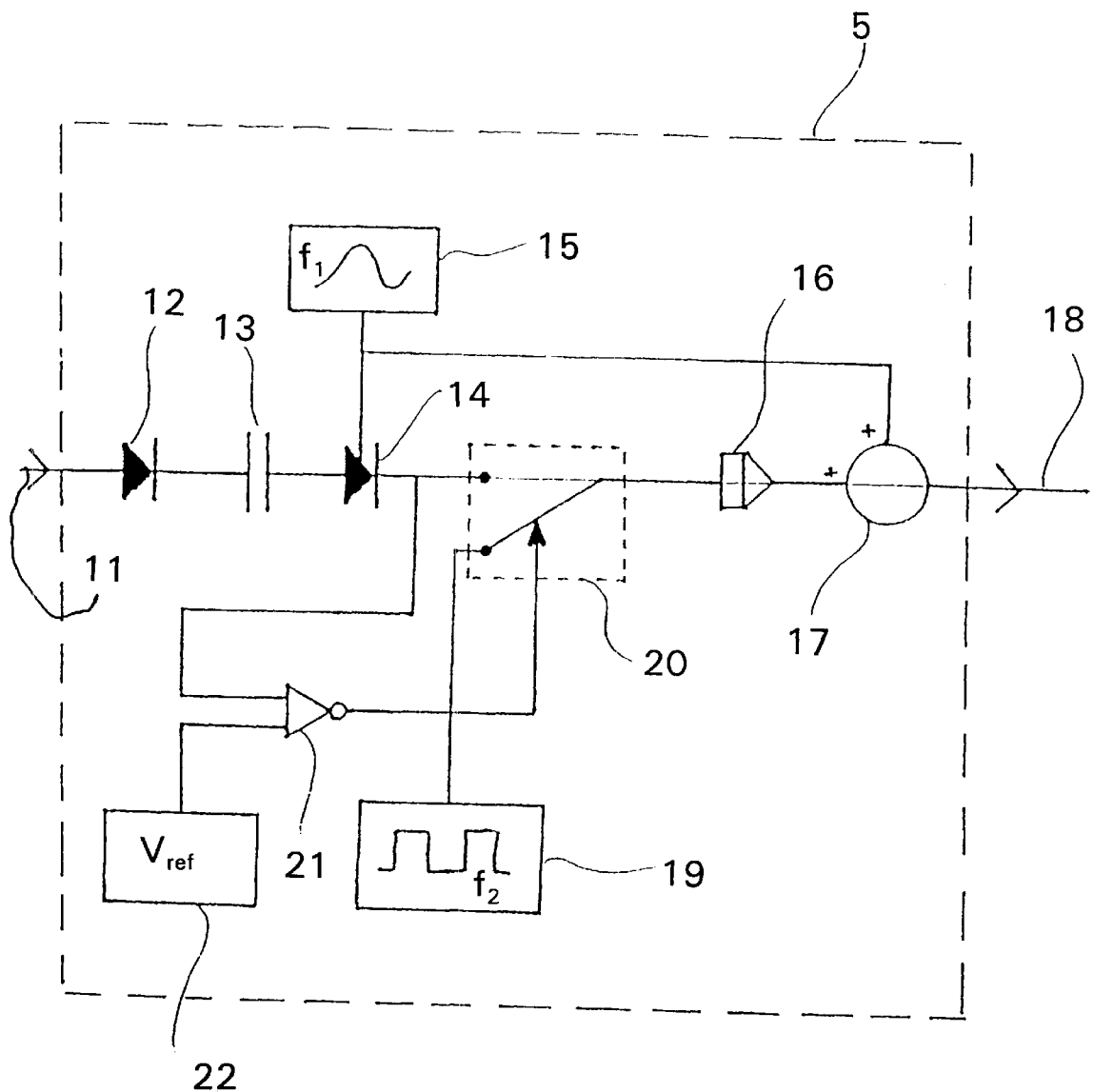
FIG. 3 is a schematic layout of the internal components of the processor of the first embodiment of the present invention shown in FIG. 1, to enable the searching function.

FIG. 3 shows an embodiment with additions to processor 5 shown in FIG. 2 which will enable a search function to be carried out. The components which make up processor 5 remain the same as that shown in FIG. 2. Additions to the circuit comprise frequency source 19 to provide a search frequency ($f_2$) of a value substantially lower than the master frequency, a voltage reference source 22, a comparator 21 and a change over switch 20 operated by the output of comparator 21. When the frequency of the excitation signal supplied by VFO 1 is substantially different from the resonant frequency of structure 2, the output of synchronous rectifier 14 will be a comparatively large DC voltage. This output is supplied to one input of comparator 21, the other input being supplied by reference voltage ($V_{ref}$) from source 22. If the output voltage of synchronous rectifier 14 is larger than this reference voltage, comparator 21 activates changeover switch 20 which disconnects the input of integrator 16 from synchronous rectifier 14 and connects it to frequency source 19. In this mode, the output of integrator 16 sweeps from a minimum value to a maximum value and back continuously. This causes VFO 1 to sweep the excitation signal over a frequency range which will encompass all possible resonant frequencies of structure 2. As the excitation signal frequency approaches the resonant frequency of structure 2, the output voltage from synchronous rectifier 14 will begin to fall. When the voltage becomes less than the reference voltage, comparator 21 will deactivate changeover switch 20 and the circuit will enter the previously described following function mode. The changeover from search function to following function must occur when the excitation frequency is sufficiently close to the resonant frequency, so as to allow the following function to track the resonant frequency. The reference voltage supplied to comparator 21 must therefore be of a sufficiently low value as to allow the transition from the search function to the following function to occur successfully. The reference voltage must also be of a sufficiently high value to allow the approach of resonance to be detected and the changeover to occur. The output from comparator 21 may be used to supply an indication that, while the search function is enabled, the frequency of the excitation signal supplied by VFO 1 is not the resonant frequency of structure 2.

Figure 4:
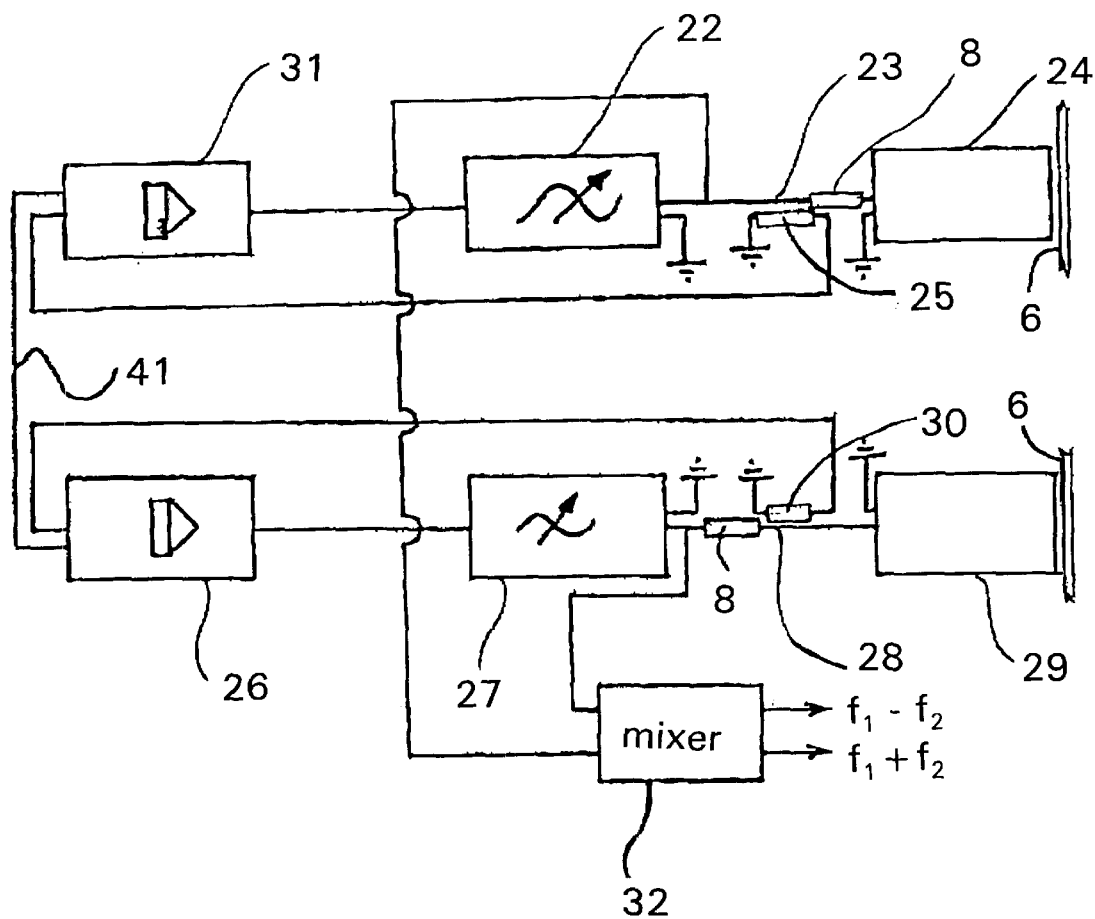
FIG. 4 is a schematic layout depicting a second embodiment of the present invention.

An embodiment of the second aspect of the invention is shown in FIG. 4. Two electrically resonant structures 24 and 29 are mounted on a surface 6 such that when the surface 6 is strained in a given direction, a differential strain is applied to each of structures 24 and 29. Each structure 24, 29 is electrically connected to tracking apparatuses via bidirectional RF transmission lines 23, 28 respectively, which incorporate directional couplers 25, 30 respectively. The tracking apparatuses consist of VFOs 22, 27 respectively and processors 31, 26 respectively. The output of directional couplers 25, 30 are connected to the input of processors 31,26 respectively. The operation of processors 31, 26 is as discussed earlier for processor 5, with the addition of synchronising signal 41 linking processors 31 and 26. The purpose of synchronising signal 41 is to link the master frequency sources of both processors 31 and 26. Alternatively, in a not shown embodiment one master frequency source could supply both processors.

In an alternative embodiment the system can include in-line couplers 8 between VFO's 22 and 27 and, respectively, structures 24 and 29 as described in our earlier mentioned co-pending PCT Application. This provides for non contact measurement of the resonant frequencies of structures 24 and 29 if they were mounted, for example, on a rotating shaft.

The outputs of VFOs 22 and 27 are input to mixer 32 with two outputs. The first output is the difference in frequency between the excitation signals of the two VFOs 22 and 27, and the second output is the sum of the frequencies of the excitation signals of the two VFOs 22 and 27. By synchronising the master frequency sources for all processors as described above, the frequency modulation of all VFOs will be synchronised, and therefore the frequency difference between any pair of VFOs will not include this modulation. By arranging structures 24 and 29 to have resonant frequencies which differ in the unstrained condition, the first output from mixer 32 will be a frequency representing the difference in resonant frequency between the two unstrained structures 24 and 29. As the surface 6 upon which structures 24 and 29 are attached is strained, the frequency measured at the first output of the mixer would rise or fall giving information containing both the magnitude and direction of the strain. Alternatively, structures 24 and 29 may have substantially the same resonant frequency, in which case only information containing the magnitude of the strain would be obtained.

In the above mentioned embodiments the electrically resonant structures 2, 24 and 29 are preferably surface acoustic wave ('SAW') resonators, shallow bulk acoustic wave ('SBAW') resonators or similar, which are partially composed of a piezoelectric material, such as quartz or directionally orientated zinc oxide. Such resonators comprise an interdigital array ('DA") which is able to electrically excite the resonator. As discussed in the above mentioned co-pending PCT Application, the change in impedance of structure 2 can be utilised to measure various physical quantities of interest. The physical quantity being measured may for example be strain imparted to structure 2 due to the straining of a surface 6 to which structure 2 is substantially rigidly mounted. Strain of this surface 6 may, for example, be caused by physical quantities such as an applied load, applied bending moment, pressure or temperature causing thermal expansion of the surface 6. Alternatively change in impedance of structure 2 may be caused directly by mass loading of structure 2 due to absorption of fluids resulting from changes in humidity or presence of specific fluids.

The apparatus and method of the present invention requires very low signal excitation power to be provided by the respective one or more VFOs and can utilise a resonant structure mounted remotely from the driving and sensing electronics. It is therefore also suited to other applications and environments where very low excitation signal power is desirable such as in high temperature and/or explosive environments where physical quantities such as strain, load, pressure, temperature, humidity, fluid presence, etc. are measured.

It will be recognised by persons skilled in the art that numerous variations and modifications may be made to the invention without departing from the spirit and scope of the invention.

What is claimed is:

1. An apparatus for tracking a varying resonant frequency of an electrically resonant structure, wherein the apparatus comprises:

a variable frequency oscillator having an output providing an excitation signal of a variable frequency encompassing a possible resonant frequency range of the resonant structure, the variable frequency oscillator having an input for controlling the output frequency thereof; and a bidirectional RF transmission line connecting the variable frequency oscillator and the resonant structure, the transmission line incorporating a directional coupler which generates a directional coupler signal proportional to a reflected signal from the resonant structure, the directional coupler signal being conditioned by a processor to provide a feedback signal to the input of the variable frequency oscillator, such that a mean frequency of the excitation signal is caused to continuously track the variable resonant frequency of the resonant structure.

2. The apparatus according to claim 1, wherein the tracking of the variable resonant frequency involves at least two functions, a first search function for initially searching the possible resonant frequency range of the resonant structure and, once resonance of the resonant structure is established, a second following function for following the variable resonant frequency as the frequency varies as a function of time.

3. The apparatus according to claim 1, wherein the processor comprises a detector which detects the directional coupler signal, a master frequency source, a synchronous rectifier for selectively rectifying an output of the detector relative to the master frequency source, an integrator for conditioning the output from the synchronous rectifier, a summer for summing the output of the integrator and the output of the master frequency source, the output of the summer being used to control the frequency of the variable frequency oscillator.

4. The apparatus according to claim 3, wherein the second input from the frequency source is synchronized with the master frequency output of the frequency source.

5. The apparatus according to claim 3, wherein the frequency source also provides a search frequency output which is substantially lower than the master frequency output and the search frequency output is input into the integrator and therefore causing the variable frequency oscillator to sweep through the possible resonant frequency range of the resonant structure in the absence of any feedback signal.

6. The apparatus according to claim 1, wherein the output of the variable frequency oscillator is monitored to indicate the resonant frequency of the electrically resonant structure.

7. The apparatus according to claim 3, wherein alternatively or additionally, an analogue signal from the output of the integrator or summer may be used indicate the resonant frequency of the resonant structure.

8. The apparatus according to claim 1, wherein the processor comprises a double balance mixer which receives the directional coupler signal from the directional coupler and the excitation signal from the variable frequency oscillator and provides a phase proportional DC output to an integrator for conditioning, the output of the integrator providing the feedback signal to the variable frequency oscillator, thereby providing the following function.

9. The apparatus according to claim 1, wherein the electrically resonant structure is at least partially composed of piezoelectric material.

10. The apparatus according to claim 9, wherein the piezoelectric material is selected from one of quartz and zinc oxide.

11. The apparatus according to claim 1, wherein the resonant structure includes one of a surface acoustic wave ('SAW') resonator and a shallow bulk acoustic wave ('SBAW') resonator.

12. The apparatus according to claim 11, wherein a variable impedance of the resonant structure results from a mass loading of the resonant structure.

13. The apparatus according to claim 1, wherein the resonant structure is mounted on a surface subject to strain such that the strain is imparted to the resonant structure.

14. The apparatus according to claim 13, wherein the strain is caused by displacement of one of an applied load, an applied bending moment, an applied pressure, or a thermal expansion caused by temperature.

15. The apparatus according to claim 13, wherein the strain is caused by one of absorption of fluids into the surface of the resonant structure in the presence of specific fluids and by physical quantities such as humidity.

16. The apparatus according to claim 1, wherein the directional coupler is one of a transformer, a Maxwell Bridge or a Lange coupler.

17. The apparatus according to claim 1, wherein the RF transmission line incorporates an in-line coupler, which is one of an untuned transformer, a tuned transformer, a laser, an optical coupler, a capacitive coupler or an RF coupler.

18. The apparatus according to claim 1, wherein the RF transmission line is a continuous electrical conductor between the frequency source and the resonant structure.

19. A device for measuring differential strain incorporating at least two apparatuses for tracking the variable resonant frequencies of at least two respective electrically resonant structures, wherein each tracking apparatus comprises a variable frequency oscillator providing an excitation signal of a variable frequency encompassing a possible resonant frequency range of the respective resonant structure, a bidirectional RF transmission line connecting the variable frequency oscillator and the respective resonant structure, the transmission line incorporating a directional coupler which generates a directional coupler signal proportional to a reflected signal from the respective resonant structure, the directional coupler signal conditioned by a processor to provide a feedback signal to the input of the variable frequency oscillator, such that a mean frequency of the excitation signal is caused to continuously track the varying resonant frequency of the respective resonant structure.

20. A device for measuring differential strain incorporating at least two apparatuses for tracking the variable resonant frequencies of at least two respective electrically resonant structures, wherein each tracking apparatus comprises a variable frequency oscillator providing an excitation signal of a variable frequency encompassing a possible resonant frequency range of the respective resonant structure, a bidirectional RF transmission line connecting the variable frequency oscillator and the respective resonant structure, the transmission line incorporating a directional coupler which generates a directional coupler signal proportional to a reflected signal from the respective resonant structure, the directional coupler signal conditioned by a processor to provide a feedback signal to the input of the variable frequency oscillator, such that a mean frequency of the excitation signal is caused to continuously track the varying resonant frequency of the respective resonant structure; and the outputs of the variable frequency oscillators of the at least two apparatuses provide inputs to a mixer, and the output of which is used to indicate the difference between the frequencies of the variabletrequency oscillators.

21. The apparatus according to claim 19, wherein the resonant frequencies of the at least two resonant structures of respective the at least two apparatuses differ from one another.

22. The apparatus according to claim 19, wherein the at least two resonant structures have substantially the same resonant frequency.

* * * * *